United States Patent
Brueck et al.

(10) Patent No.: US 9,293,679 B2
(45) Date of Patent: Mar. 22, 2016

(54) THERMOELECTRIC MODULE FOR A THERMOELECTRIC GENERATOR OF A VEHICLE AND VEHICLE HAVING THERMOELECTRIC MODULES

(71) Applicant: EMITEC GESELLSCHAFT FUER EMISSIONSTECHNOLOGIE MBH, Lohmar (DE)

(72) Inventors: Rolf Brueck, Bergisch Gladbach (DE); Sigrid Limbeck, Much (DE)

(73) Assignee: EMITEC Gesellschaft fuer Emissionstechnologie mbH, Lohmar (DE)

( * ) Notice: Subject to any disclaimer, the term of this patent is extended or adjusted under 35 U.S.C. 154(b) by 135 days.

(21) Appl. No.: 13/975,780

(22) Filed: Aug. 26, 2013

(65) Prior Publication Data

US 2013/0340803 A1 Dec. 26, 2013

Related U.S. Application Data

(63) Continuation of application No. PCT/EP2012/053033, filed on Feb. 22, 2012.

(30) Foreign Application Priority Data

Feb. 25, 2011 (DE) .......................... 10 2011 012 448

(51) Int. Cl.
*H01L 35/28* (2006.01)
*H01L 35/30* (2006.01)
(Continued)

(52) U.S. Cl.
CPC ................ *H01L 35/30* (2013.01); *H01L 35/32* (2013.01); *F01N 5/025* (2013.01)

(58) Field of Classification Search
None
See application file for complete search history.

(56) References Cited

U.S. PATENT DOCUMENTS 3,601,887 A 8/1971 Mitchell et al.
3,610,809 A * 10/1971 Eigenbrod .................... 174/15.5
(Continued)

FOREIGN PATENT DOCUMENTS

DE 3809310 A1 10/1988
DE 102006039024 A1 2/2008
(Continued)

OTHER PUBLICATIONS

International Search Report of PCT/EP2012/053033, Dated Apr. 19, 2013.

*Primary Examiner* — Eli Mekhlin
(74) *Attorney, Agent, or Firm* — Laurence A. Greenberg; Werner H. Stemer; Ralph E. Locher

(57) ABSTRACT

A thermoelectric module includes an interrupted inner circumferential surface, an axis and an outer circumferential surface. A plurality of semiconductor elements having thermoelectric material are disposed in direction of the axis and between the inner circumferential surface and the outer circumferential surface and are electrically alternately connected to each other. At least some of the semiconductor elements include at least one inner frame part or an outer frame part and at least the inner frame parts form the interrupted inner circumferential surface. The inner circumferential surface also forms a cold side of the thermoelectric module and a dimensionally unstable sheath is provided at least at the interrupted inner circumferential surface. A vehicle having a plurality of thermoelectric modules is also provided.

8 Claims, 3 Drawing Sheets

(51) Int. Cl.
*H01L 35/32* (2006.01)
*F01N 5/02* (2006.01)

(56) References Cited

U.S. PATENT DOCUMENTS

| | | | |
|---|---|---|---|
| RE35,441 E * | 2/1997 | Yokotani et al. | 257/64 |
| 7,765,811 B2 | 8/2010 | Hershberger et al. | |
| 7,868,242 B2 * | 1/2011 | Takahashi | 136/200 |
| 2003/0140957 A1 * | 7/2003 | Akiba | 136/224 |
| 2007/0199587 A1 * | 8/2007 | Takahashi | 136/208 |
| 2008/0223427 A1 | 9/2008 | Ohno | |
| 2009/0020188 A1 * | 1/2009 | Ulicny et al. | 148/402 |
| 2010/0072943 A1 * | 3/2010 | Mahawili | 320/101 |

FOREIGN PATENT DOCUMENTS

| | | |
|---|---|---|
| EP | 1981095 A2 | 10/2008 |
| KR | 1020020037964 A | 5/2002 |
| KR | 1020100120339 A | 11/2010 |

* cited by examiner

THERMOELECTRIC MODULE FOR A THERMOELECTRIC GENERATOR OF A VEHICLE AND VEHICLE HAVING THERMOELECTRIC MODULES

CROSS-REFERENCE TO RELATED APPLICATION

This is a continuation application, under 35 U.S.C. §120, of copending International Application No. PCT/EP2012/053033, filed Feb. 22, 2012, which designated the United States; this application also claims the priority, under 35 U.S.C. §119, of German Patent Application DE 10 2011 012 448.9, filed Feb. 25, 2011; the prior applications are herewith incorporated by reference in their entirety.

BACKGROUND OF THE INVENTION

Field of the Invention

The present invention relates to a thermoelectric module, in particular for use in a thermoelectric generator which is used in a vehicle. The invention also relates to a vehicle having a plurality of thermoelectric modules.

The exhaust gas from an internal combustion engine of a motor vehicle contains thermal energy which can be converted into electric energy by using a thermoelectric generator in order, for example, to charge a battery or some other energy storage device and/or to feed the required energy directly to electric loads. In that way, the motor vehicle is operated with better energy efficiency, and there is more energy available to operate the motor vehicle.

A thermoelectric generator of that kind has at least one thermoelectric module. Thermoelectric modules include, for example, at least two semiconductor elements (p-doped and n-doped), which are provided on the upper side and the lower side thereof (facing the hot side or the cold side) with alternate electrically conducting bridges and which form the smallest thermoelectric unit or a thermoelectric element. Thermoelectric materials can convert thermal energy into electric energy (Seebeck effect) and vice versa (Peltier effect). If a temperature gradient is provided on both sides of the semiconductor elements, a voltage potential is formed between the ends of the semiconductor elements. The charge carriers on the hotter side are excited into the conduction band to an increased extent by the higher temperature. Due to the difference in concentration produced during that process in the conduction band, charge carriers diffuse to the colder side of the semiconductor element, giving rise to the potential difference. In a thermoelectric module, it is preferable if a large number of semiconductor elements is connected electrically in series. In order to ensure that the potential differences generated in the serial semiconductor elements do not cancel each other out, alternate semiconductor elements are always brought into direct electric contact with different majority charge carriers (n-doped and p-doped). Through the use of a connected electric load resistor, the circuit can be closed and thus electric power can be taken off.

In order to ensure that the semiconductor elements are fit for operation on a sustained basis, a diffusion barrier is generally disposed between the electrically conducting bridges and the thermoelectric material, preventing diffusion of material contained in the electric bridges or in the solder or brazing material into the thermoelectric material. That counteracts a loss of effectiveness or functional failure of the semiconductor material and of the thermoelectric element. The construction of thermoelectric modules and of the semiconductor elements is usually accomplished by assembling the individual components, namely the thermoelectric material, the diffusion barrier, the electrically conducting bridges, the insulation and, if appropriate, additional housing elements. That assembly of numerous individual components also requires precise matching of the individual component tolerances and allowance for the heat transfers from the hot to the cold side and adequate contacting of the electrically conducting bridges to enable a flow of current through the thermoelectric material to be produced.

In order to enable such semiconductor elements to be disposed in a thermoelectric module, housings, walls and/or supporting tubes for external delimitation of the module, on which the semiconductor elements are secured, are generally provided. That leads, in particular, to the need for high tolerance requirements during manufacture in order, on one hand, to achieve an accurately fitting configuration of the semiconductor elements in relation to the electrical connections and to the position of the housings. Another problem is the fact that, due to the different thermal stresses on the outer and inner housing parts, there is also a need to compensate for different expansion behavior by the components without introducing particularly high stresses into the thermoelectric material. Precisely with respect to such manufacture of thermoelectric modules, there is a desire to be able to combine the large number of components easily with one another, to simplify storage and handling and also to produce a light, stable structure during assembly.

In the case of thermoelectric modules, the efficiency is determined substantially by the heat flow from the hot side to the cold side. The hot side is generally acted upon by a gaseous exhaust gas and the cold side is acted upon by a liquid coolant. Since the heat capacity of a gaseous medium is generally significantly less than that of a liquid medium, it is advantageous to increase the area for heat transfer from the gaseous medium. For that reason, it is precisely when a larger heat transfer surface is provided on the hot side that the efficiency of a thermoelectric module can be significantly improved.

BRIEF SUMMARY OF THE INVENTION

It is accordingly an object of the invention to provide a thermoelectric module for a thermoelectric generator of a vehicle and a vehicle having thermoelectric modules, which overcome the hereinafore-mentioned disadvantages and at least partially solve the highlighted problems of the heretofore-known modules and vehicles of this general type. In particular, the intention is to specify a thermoelectric module which can be produced in a technically simple manner, has a reduced number of parts, is stable for the desired application and/or furthermore has a high efficiency in order to produce electric energy from the thermal energy of an exhaust gas.

With the foregoing and other objects in view there is provided, in accordance with the invention, a thermoelectric module, comprising an inner circumferential surface, an axis and an outer circumferential surface, wherein a plurality of semiconductor elements containing thermoelectric material is disposed in the direction of the axis and between the inner circumferential surface and the outer circumferential surface and connected electrically to one another in alternation. Moreover, at least some of the semiconductor elements have at least an inner frame part, with the result that the inner frame parts form an interrupted inner circumferential surface. The inner circumferential surface forms a cold side of the thermoelectric module, and a dimensionally unstable sheath is furthermore provided at least at the interrupted inner circumferential surface.

In particular, the thermoelectric module forms a separate subassembly in a thermoelectric generator. It is preferred in this case that the thermoelectric module have a terminal through which, if appropriate, such a thermoelectric module can be electrically interconnected with a multiplicity of further thermoelectric modules. In particular, the electric connection or interconnection of all of the semiconductor elements integrated into the thermoelectric module is therefore implemented within the module. Such a thermoelectric module is then exposed, on one hand, to a cooling medium and, on the other hand, to a heating medium. The particular focus in this case is that the thermoelectric module should be brought into contact with a cooling medium through its inner circumferential surface and with a heating medium (in particular an exhaust gas) over its outer circumferential surface, or that there should be a flow of the media through or around the thermoelectric module. In practice, therefore, the inner circumferential surface forms a so-called "cold side" and the outer circumferential surface forms a so-called "hot side" of the thermoelectric module.

It is furthermore preferred if the thermoelectric module has an elongate construction, that is to say, for example, in the manner of a rail or of a tube. Even if it is very particularly preferred that the thermoelectric module should be configured approximately in the manner of a cylinder or a tube, such a shape is not compulsory. In particular, oval cross sections or polygonal cross sections may also be considered for such a thermoelectric module. In accordance with this configuration, it is then also possible to identify a central axis and an inner circumferential surface and an outer circumferential surface. In particular, the inner circumferential surface in this case delimits an inner duct or channel, through which the cooling medium can flow. Through the use of this configuration, it is possible to increase the efficiency of the tubular thermoelectric module significantly because the gaseous exhaust gas acts upon the large-area outer circumferential surface and the cooling medium is passed through the inner duct.

The thermoelectric materials are positioned between the inner circumferential surface and the outer circumferential surface, with the materials each being assigned to so-called "semiconductor elements." A multiplicity of such semiconductor elements can be disposed, stacked one upon the other, in the direction of the axis, in particular in such a manner that a semiconductor element containing p-doped thermoelectric material and a semiconductor element containing n-doped thermoelectric material are disposed alternately, adjacent one another. To this extent, it is very particularly preferred if the semiconductor element with a predetermined doping extends completely around the inner circumferential surface, e.g. in the manner of disks or rings. This thermoelectric material is then framed by an inner frame part and/or an outer frame part. It is preferred that the semiconductor element in each case have an inner frame part and an outer frame part, which respectively completely surround the thermoelectric material on the inside and the outside. In accordance with the shape of the semiconductor element, the frame parts are embodied in the manner of rings or cylinders, for example.

As a particularly preferred option, the thermoelectric material is force-lockingly connected (by pressure) to the frame parts. "Force-locking joints" are formed by the transmission of forces. These include pressure forces and/or frictional forces, for example. The force-locking joint is held together purely by the effective force.

It is furthermore preferred that the frame parts simultaneously form a diffusion barrier for the thermoelectric material and an electric conductor. Nickel or molybdenum are preferred as materials for the frame parts and, as a very particularly preferred option, there is at least 95% by weight of the materials in the material of the frame parts. The following materials, in particular, are regarded as suitable as thermoelectric materials:

n-type: $Bi_2Te_3$; $PbTe$; $Ba_{0.3}Co_{3.95}Ni_{0.05}Sb_{12}$; $Ba_y(Co,Ni)_4Sb_{12}$; $CoSb_3$; $Ba_8Ga_{16}Ge_{30}$; $La_2Te_3$; $SiGe$; $Mg_2(Si,Sn)$;

p-type: $(Bi,Sb)_2TE_3$; $Zn_4Sb_3$; TAGS; $PbTe$; $SnTe$; $CeFe_4Sb_{12}$; $Yb_{14}MnSb_{11}$; $SiGe$; $Mg_2(Si,Sb)$.

The thermoelectric materials or semiconductor elements are then connected to one another electrically in alternation, and a flow of current through the thermoelectric module and the thermoelectric materials therefore arises due to the temperature difference between the inner circumferential surface and the outer circumferential surface. The electrical connection can be achieved by using a metal bridge, a cable, solder, brazing material or the like. As already explained, the electrical connection is preferably achieved (only) by using the frame part.

In the embodiment of the thermoelectric module according to the invention, at least the inner frame parts do not form a continuous inner circumferential surface and/or, in addition, the outer frame parts do not form a continuous outer circumferential surface, if appropriate. This is intended, in particular, to express the fact that at least the inner circumferential surface and, if appropriate, additionally the outer circumferential surface, are not embodied in the form of a continuous housing wall but that interruptions are provided in this case. If the thermoelectric module were constructed in the manner of a tube, for example, a continuous cylindrical inner circumferential surface and/or a continuous cylindrical outer circumferential surface would be provided. However, the inner frame parts are now used to form just a part of the cylindrical inner circumferential surface, with the result that part of the (imaginary) cylindrical inner circumferential surface is free or interrupted. If appropriate, this applies in a corresponding manner to an (imaginary) cylindrical outer circumferential surface, which is then likewise not formed completely by the outer frame parts. Even if this is illustrated in this case with respect to a tube-like thermoelectric module, this consideration can also be applied logically to other cross-sectional shapes of the thermoelectric module. These interruptions in the outer circumferential surface make it possible, for example, for the inner frame parts to be reached from the outside for installation and/or joining steps, even after the assembly of the semiconductor elements. Another reason for the interruptions proposed herein is that the thermoelectric module or the stacked and/or joined configuration of the semiconductor elements is not rigid in the direction of the axis in the region of the outer circumferential surface or the inner circumferential surface but rather the interruptions can be used to compensate for thermal expansion and/or manufacturing tolerances. Moreover, if each (centrally disposed) semiconductor element is used to form a connecting region with the adjacent semiconductor element, both in the region of the inner circumferential surface and in the region of the outer circumferential surface (that is to say, for example, at one end through the outer frame part and at the other end through the inner frame part), a dimensionally stable structure of a thermoelectric module can be achieved without the need of a further housing for this purpose in order to stabilize or support the configuration. In particular, it is possible to dispense with an additional inner rigid casing tube and/or an outer rigid casing tube. From this, it can immediately be recognized that this configuration of semiconductor elements or the formation and connection of the respective frame parts can be carried out in a technically simple manner. Moreover, it is possible in this way to create a robust configuration which is suitable for further processing steps and for subsequent use in the thermoelectric generator.

Moreover, it is regarded as advantageous that a dimensionally unstable sheath is provided at least at the interrupted inner circumferential surface or, if appropriate, additionally at the interrupted outer circumferential surface. The provision of a dimensionally unstable sheath of this kind serves, in particular, to prevent unwanted substances from penetrating into the intermediate zone between the thermoelectric materials or semiconductor elements. For this purpose, in particular, plastic films, e.g. a "heat-shrink sleeve" (on the outer circumferential surface) can be used. In particular, an expansion hose which has a preloading force directed toward the outer circumferential surface at room temperature is provided at the inner circumferential surface. The term "expansion hose" expresses the fact that the sheath expands outward without the action of external force. That is to say, it has an outward-directed preloading force. During the configuration of the sheath on the inner circumferential surface of the thermoelectric module, the sheath comes to rest on the inner frame parts due to the outward-directed preloading force, and thus protects the semiconductor elements from a medium, in particular a cooling medium, flowing over the inner circumferential surface during the operation of the thermoelectric module. Thus, it is possible, for example, for water flowing around the inner circumferential surface to be prevented from coming into contact with the electric circuit and/or the thermoelectric material in the thermoelectric module, by using the dimensionally unstable sheath. The term "dimensionally unstable" sheath as used herein is intended, in particular, to express the fact that the stability of the thermoelectric module is affected only very slightly or only to a negligible degree by the sheath. This stability is supposed to be achieved by the connecting regions between the adjacent frame parts. A further advantage of the dimensionally unstable sheath is that it can be deformed elastically in the case of thermal stress on the thermoelectric module. Thus, the sheath does not produce any additional stresses that could impose a load on the thermoelectric module. Particularly in the case of thermal loading of the thermoelectric module, the preloading force is at least partially maintained. Thus, the sheath does not produce a tensile force on the semiconductor elements or on the configuration of the components in the thermoelectric module at any time during operation, even when there is alternating thermal stress on the thermoelectric module. Such a situation pertains particularly when rigid tubes are used as the inner circumferential surface or the outer circumferential surface of a thermoelectric module. Since the rigid tubes are each in direct contact with an exhaust gas or a cooling medium, for example, they heat up more quickly or cool more quickly than the other components of the thermoelectric module. Thus, the rigid tubes induce thermal stresses in the thermoelectric module, and these can lead, in particular, to failure of contact between individual components (semiconductor elements, electrically conductive bridges, insulating layer), at least in the radial direction of the thermoelectric module. Through the use of inner frame parts and of the correspondingly interrupted inner circumferential surface, differential expansion or shrinkage of individual components of the thermoelectric module is to a large extent compensated in the case of alternating thermal stress. Moreover, the dimensionally unstable sheath does not induce any further thermal stresses in the thermoelectric module.

In accordance with another feature of the thermoelectric module of the invention, semiconductor elements contain thermoelectric material which is disposed between an inner frame part and an outer frame part, wherein at least the inner frame part and, if appropriate, additionally the outer frame part each project on one side beyond the thermoelectric material and there form a dimensionally rigid connecting region with an adjacent frame part. As a very particularly preferred option in this context, all of the semiconductor elements of the thermoelectric module (with the exception of the semiconductor elements at the beginning and end) form corresponding connecting regions with adjacent frame parts. As a very particularly preferred option in this case, outer frame parts are always connected to outer frame parts and inner frame parts are always connected to inner frame parts. To this extent, it is advantageous if the inner frame parts and the outer frame parts project in different directions parallel to the axis in the case of an individual semiconductor element. In this case, it is possible for each frame part to project with respect to just one side of the thermoelectric material. However, it is preferred that, on one hand, the inner frame part and, on the other hand, the outer frame part should project furthest on each of the two sides of the thermoelectric material. Such a dimensionally rigid connecting region can be achieved, for example, by a soldered/brazed joint, an adhesive joint or a welded joint. The connecting regions are, in particular, constructed (to be dimensionally stable) in such a way that they can absorb static, dynamic and thermal forces in the direction of the axis and/or radially thereto arising during the operation of a thermoelectric generator in the vehicle. For this purpose, it is very particularly preferred that the connecting region should extend in each case over the entire circumference of the frame parts, e.g. as an encircling weld seam between adjacent inner frame parts and, if appropriate, between adjacent outer frame parts. These connecting regions ensure, in particular, that the thermoelectric module is dimensionally rigid or stable, thus ensuring captive configuration of the plurality of semiconductor elements. In such a thermoelectric module, there are, in particular, more than 10, in particular more than 30, and preferably more than 50 such semiconductor elements stacked and embodied alternately with connecting regions. Even in the case of such large, elongate thermoelectric modules, it is possible to dispense with a stabilizing additional inner wall and/or additional outer wall, thereby making it possible, in particular, to reduce the production effort and the outlay on materials.

According to a preferred embodiment of the thermoelectric module, at least the inner frame part or the outer frame part has an insulating layer. This insulating layer can be provided locally on and/or over all of the surface of the inner frame part and/or the surface of the outer frame part, and, in particular, is used for electric insulation of the current paths. In particular, an insulating layer including aluminum oxide ($Al_2O_3$) or the like may be considered for this purpose.

It is furthermore regarded as advantageous that a free space is formed between adjacent inner frame parts in the interrupted inner circumferential surface, corresponding to a spacing between the thermoelectric material of adjacent semiconductor elements. In particular, this also expresses the fact that the configuration of the semiconductor elements with the inner frame parts is such that as large as possible a free space is created in the region of the interruption in the inner circumferential surface, and this free space is, in particular, not restricted by projecting regions of the inner frame parts.

In particular, this makes it possible for the maximum available free space to be used in this case in order, for example, to implement from outside the connecting regions to the outer frame parts in this free space. Thus, it is possible, in particular by using a welding device, to form a weld seam between the outer frame parts situated on the outside without damaging any insulation present between the semiconductor elements (in the free space) through the connection process. In the assembled state, a free space that runs around in the circumferential direction and is defined by the circumferential surface, situated radially on the inside, of the adjacent outer frame parts, of the opposite top side and bottom side of the adjacent thermoelectric materials, and of the associated interruption in the inner circumferential surface is often formed. If a cylindrical, tubular thermoelectric module is specified, the free space consequently has substantially the shape of a ring which is disposed concentrically with the axis and extends between adjacent thermoelectric materials.

Similar statements apply, in particular, also to the outer frame parts, thus providing access from the outside to inner frame parts. Through the use of the free space between the semiconductor elements, it is possible to produce a connection between inner frame parts. In particular, this is achieved by the fact that the outer frame parts end flush with a side face of the thermoelectric material. The adjacent outer frame parts are thus then spaced apart by an amount corresponding to the distance between the respective top side and bottom side of the adjacent thermoelectric materials. In the assembled state, a free space running around in the circumferential direction and defined by the circumferential surface, situated radially on the outside, of the adjacent inner frame parts, of the opposite top side and bottom side of the adjacent thermoelectric materials, and of the associated interruption in the outer circumferential surface, is thus correspondingly formed.

In accordance with a further feature of the thermoelectric module of the invention, a free space is formed between adjacent inner frame parts, at least in the interrupted inner circumferential surface, the free space being filled with a porous insulating material. This means, in particular, that the free space between adjacent thermoelectric materials, the free space being accessible radially from the inside, is not filled (exclusively) with air but that, in this case (in addition), a porous insulating material is provided. In particular, the material then serves to provide an electric insulation in the transition zone between adjacent semiconductor elements. The insulating material can likewise serve to reduce or prevent a significant temperature equalization between the inner circumferential surface and the outer circumferential surface in the region of the free space. The porous embodiment of the insulating material leads, in particular, to it being very light while nevertheless having the capacity to contain a high proportion of air as a thermal insulator. In particular, a highly porous solid body in which, for example, at least 95% or even at least 99% of the volume is formed of cells is suitable for consideration as a porous insulating material of this kind. In this case, the insulating material preferably has a highly dendritic structure, i.e. branching of particle chains with a very large number of interspaces in the form of open cells, with the result, in particular, that a relatively stable sponge-type network structure is formed. The use of an "aerogel," e.g. one based on a silicate, is a very particularly preferred option in this case. If appropriate, the porous insulating material can also additionally be disposed in the free space formed between adjacent outer frame parts.

In accordance with an added advantageous feature of the thermoelectric module of the invention, the dimensionally unstable sheath provided at least at the inner circumferential surface is an expansion hose which has a preloading force directed toward the outer circumferential surface at room temperature.

In accordance with an additional advantageous feature of the thermoelectric module of the invention, the dimensionally unstable sheath/expansion hose has at least one spring element, which produces the preloading force. The spring element is, in particular, a spring ring which is connected to the dimensionally unstable sheath. This spring ring is compressed and pushed into the inner duct in order to install the unstable sheath. The spring action of the at least one spring ring fixes the dimensionally unstable sheath on the inner circumferential surface of the thermoelectric module. In particular, the at least one spring ring rests at least partially on the inner frame parts, and is not disposed exclusively in the region of the free space. However, such a configuration (spring ring resting exclusively in the region of the free space) can be advantageous particularly if a (nongaseous) insulating material is disposed in the free space.

In accordance with yet another advantageous feature of the thermoelectric module of the invention, the dimensionally unstable sheath is composed at least partially of at least one of the following materials: shape memory alloy (SMA) or shape memory polymer (SMP).

The dimensionally unstable sheath (or also the expansion hose) can thus be disposed on the inner circumferential surface and converted to its original shape by heating, for example. This original shape is preferably larger than the inner circumferential surface of the thermoelectric module, so that, after conversion, a preloading force directed radially outward is produced at the inner circumferential surface. Shape memory materials are distinguished by the fact that, despite large subsequent deformation, they can "remember" an original shape. In this case, materials which have a "one-way (memory) effect" are particularly preferred for the dimensionally unstable sheath. This effect includes a one-time change of shape, e.g. when heated. A reversal of shape is not possible in this case. It is thereby possible to ensure that the dimensionally unstable sheath is permanently positioned, once disposed on the inner circumferential surface. At least one of the following materials is suitable as a shape memory alloy: nickel-titanium, copper-zinc, copper-zinc-aluminum, copper-aluminum-nickel and/or iron-nickel-aluminum alloys. A shape memory polymer includes, for example, a thermoplastic, a thermosetting material, interpenetrating networks, semi-interpenetrating networks and/or mixed networks. The polymer can be a single polymer or a mixture of polymers. Polymers can be straight-chain or branched thermoplastic elastomers with side chains or dendritic structural elements. Suitable polymer components to form a shape memory polymer include, for example, polyphosphazenes, polyvinyl alcohols, polyamides, polyester amides, polyamino acids, polyanhydrides, polycarbonates, polyacrylates, polyalkylenes, polyacrylamides, polyalkylene glycols, polyalkylene oxides, polyalkylene terephthalates, polyorthoesters, polyvinylethers, polyvinylesters, polyvinylhologenides, polyesters, polylactides, polyglycolides, polysiloxanes, polyurethanes, polyethers, polyetheramides, polyetheresters and copolymers thereof. If appropriate, the materials can also be combined in order to form a dimensionally unstable sheath, and, if appropriate, connecting elements (flexibly) hold together separate parts (e.g. rings) composed of different materials. The configuration of the materials in the dimensionally unstable sheath can be performed, in particular, while taking into account the temperature stresses during operation.

In accordance with yet a further feature of the thermoelectric module of the invention, the preloading force of the dimensionally unstable sheath/expansion hose on the inner frame parts is at least 15 N/mm² [Newtons per square millimeter], in particular at least 20 N/mm², at room temperature (20° C.). According to an advantageous embodiment, the preloading force on the inner frame parts is at least 10 N/mm², preferably at least 15 N/mm², at a temperature of between 150° C. and 250° C. at the dimensionally unstable sheath.

In accordance with yet an added feature of the invention, it is regarded as advantageous to place an adhesive between the dimensionally unstable sheath and the inner circumferential surface and, if appropriate, additionally between the dimensionally unstable sheath and the outer circumferential surface. In particular, this adhesive is disposed between the dimensionally unstable sheath and the inner frame part forming the inner circumferential surface. It is thus possible for an appropriate adhesive, which has a "low" temperature stability of at least 150° C., in particular at least 200° C., to be employed on the "cold side" of the thermoelectric module. In this case, the maximum temperature stability is, in particular, 250° C. In particular, the adhesive is thermally conductive, and therefore the heat flow through the thermoelectric module is influenced only to a slight extent.

It is furthermore regarded as advantageous that the thermoelectric material of the semiconductor elements is provided at least in part with a coating. Such a coating serves, in particular, to permanently ensure the composition or constitution of the thermoelectric material. In particular, the coating is provided over the entire area of the side faces or the upper side and/or the underside of the thermoelectric material, with the result that, as a particularly preferred option, the thermoelectric material is completely encased by an inner frame part, an outer frame part and the coating.

With the objects of the invention in view, there is concomitantly provided a vehicle, in particular a motor vehicle, comprising an internal combustion engine, an exhaust system, a cooling system, and a thermoelectric generator having a plurality of the thermoelectric modules according to the invention, the exhaust system extending externally along the outer circumferential surface of the thermoelectric module, and the cooling system extending through the inner circumferential surface of the thermoelectric module. In other words, this also means that, for example, the coolant of the coolant system flows internally through a duct delimited by the inner circumferential surface of the thermoelectric modules, and therefore the inner circumferential surface of the thermoelectric module represents the cold side. This likewise means that the hot exhaust gas is guided along the outside of the outer circumferential surface of the thermoelectric modules, with the result that the outer circumferential surface then forms the hot side. It is particularly preferred that the thermoelectric generator be constructed in the manner of a tube bundle, in which case, on one hand, a multiplicity of the thermoelectric modules is then connected to the cooling system and there is therefore a flow of coolant through the modules and, on the other hand, the thermoelectric modules are disposed in a common (spaced) housing, for example, thus allowing an exhaust gas to flow jointly around them. Of course, corresponding electric terminals and leads have to be provided in order to implement reliable power generation and transmission of the power, of the coolant and of the exhaust gas.

Other features which are considered as characteristic for the invention are set forth in the appended claims, noting that the features presented individually in the claims can be combined in any technologically meaningful way and give rise to additional embodiments of the invention.

Although the invention is illustrated and described herein as embodied in a thermoelectric module for a thermoelectric generator of a vehicle and a vehicle having thermoelectric modules, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE INVENTION

Figure 1:
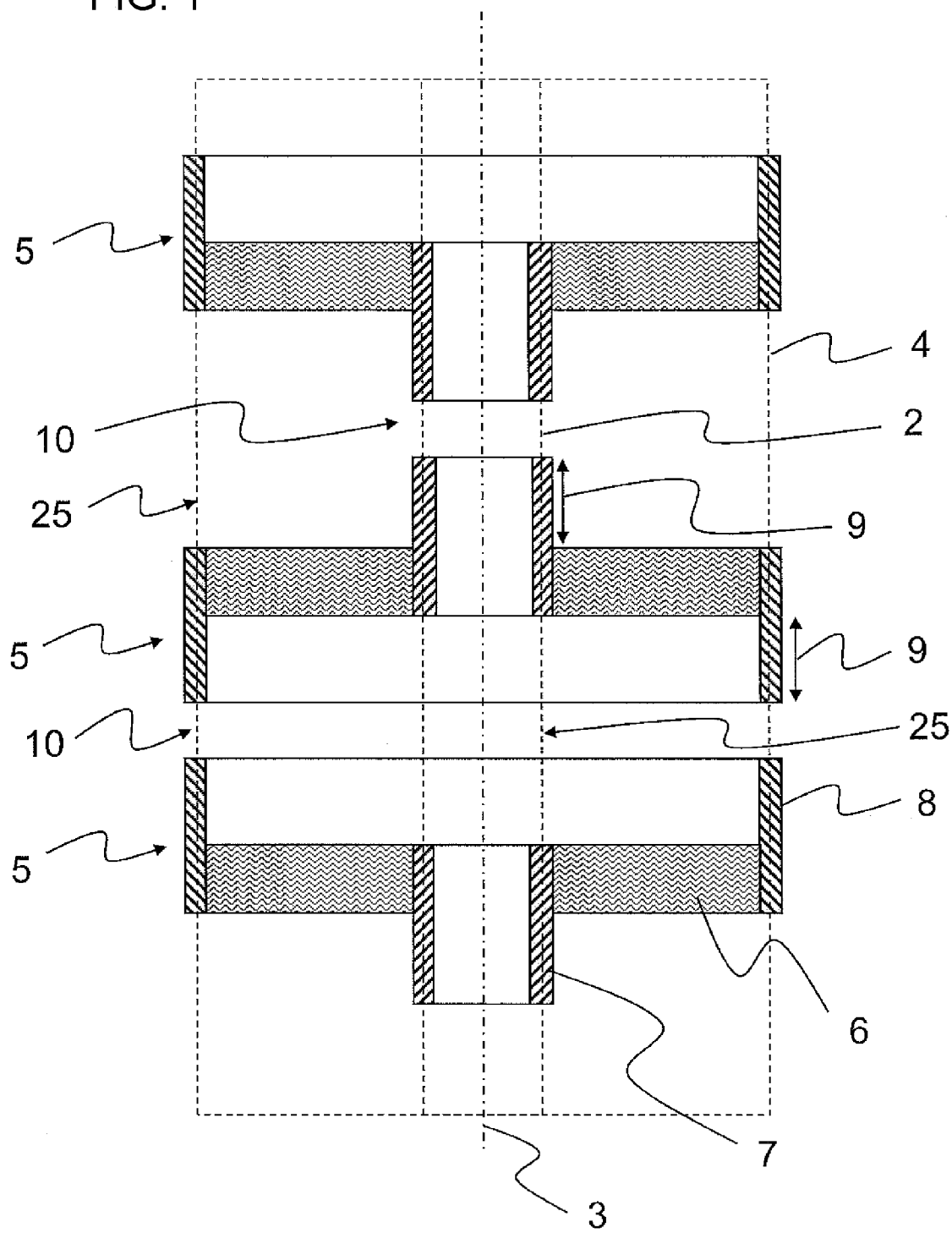
FIG. 1 is a diagrammatic, longitudinal-sectional view of a configuration of a plurality of semiconductor elements to form a thermoelectric module.

Referring now to the figures of the drawings in detail and first, particularly, to FIG. 1 thereof, there is seen a diagrammatic illustration of how a plurality of semiconductor elements 5 can be assembled to produce a thermoelectric module having the properties according to the invention. First of all, it should be noted herein that all of the semiconductor elements 5 are of substantially identical construction, in particular with regard to the configuration and dimensions of an outer frame part 8, thermoelectric material 6 and an inner frame part 7. The appropriate connection or desired structure of the thermoelectric element is then achieved by placing the semiconductor elements 5 alternately relative to one another with opposite orientations in the direction of an axis 3. This then ensures that the adjacent semiconductor elements 5 come into contact either (only) by the inner frame parts 7 or the outer frame parts 8 during a stacking process. It is very particularly preferred in this case that the thermoelectric materials 6 of all of the semiconductor elements 5 which are aligned in a first direction along the axis 3 should have the same doping (e.g. n-doping). The respective semiconductor elements 5 disposed therebetween, which are aligned in a second, opposite direction along the axis 3, have a different doping (e.g. p-doping).

In the variant embodiment shown therein, the semiconductor elements 5 are embodied in the manner of ring-shaped disks, wherein the thermoelectric material 6, in particular, is embodied in the manner of a circular-ring disk. The radially inner circumferential surface and outer circumferential surface of the thermoelectric material 6 are respectively covered by the (integral) outer frame part 8 and the (integral) inner frame part 7. The semiconductor elements 5 are furthermore configured in such a way that the outer frame parts 8 form an overlap 9 on one side of the thermoelectric material 6, while the inner frame parts 7 form an overlap 9 beyond the thermoelectric material 6 on the opposite side. This embodiment, together with the alternately opposing orientation of the overlaps, then makes it possible for adjacent semiconductor elements 5 to form connecting regions 10 across the inner frame parts 7 and across adjacent outer frame parts 8. In this case, the overlaps 9 form a kind of ring-shaped collar and the collars can be (butt-) jointed at the ends. This butt-jointing region is used, in particular, for the formation of material joints (joints in which the participants in the joint are held together by atomic and/or molecular forces, as in adhesive bonding, soldering/brazing, welding etc., are referred to as material joints), in particular encircling weld seams.

It can furthermore already be seen from FIG. 1 that the semiconductor elements 5 assembled in this way do not form a continuous inner circumferential surface 2 or a continuous outer circumferential surface 4. This can be recognized, in particular, from the fact that no outer frame part 8 is provided on the outside in a longitudinal section in which a connecting region 10 between the inner frame parts 7 is formed, and vice versa. This also means, in particular, that an (individual) outer frame part 8 does not simultaneously come into contact with both adjacent outer frame parts 8 of the adjacent semiconductor elements 5. It is likewise the case that an (individual) inner frame part 7 of a semiconductor element 5 is not in contact with both frame parts 7, 8 of adjacent semiconductor elements 5. Thus, the outer frame parts 8 do not completely fill the outer (imaginary) outer circumferential surface 4, and likewise the inner frame parts 7 do not fill the entire inner circumferential surface 2. On the contrary, interruptions 25 are formed in both cases. In this case, the starting point is, in particular, that the inner circumferential surface 2 and the outer circumferential surface 4 can be described by circumferential surface segments which are substantially at the same distance from the axis 3. If the module is a cylindrical, tube-like thermoelectric module, for example, the outer frame parts 8 and the inner frame parts 7 are, for example, likewise of cylindrical form and, consequently, cylindrical inner circumferential surfaces 2 and outer circumferential surfaces 4 are formed, extending through the respective outer frame parts 8 and inner frame parts 7. Corresponding considerations can come into play, for example, if the frame parts form an elliptical or polygonal circumferential surface. The thermoelectric module then accordingly also has overall an elliptical or polygonal inner circumferential surface/outer circumferential surface, in which the corresponding circumferential segments of the outer frame parts and inner frame parts are each located. Then, according to the invention, in particular, the outer frame parts 8 and inner frame parts 7 do not form a continuous inner circumferential surface/outer circumferential surface but an interrupted inner circumferential surface/outer circumferential surface, i.e. one which is not completely filled out.

Figure 2:
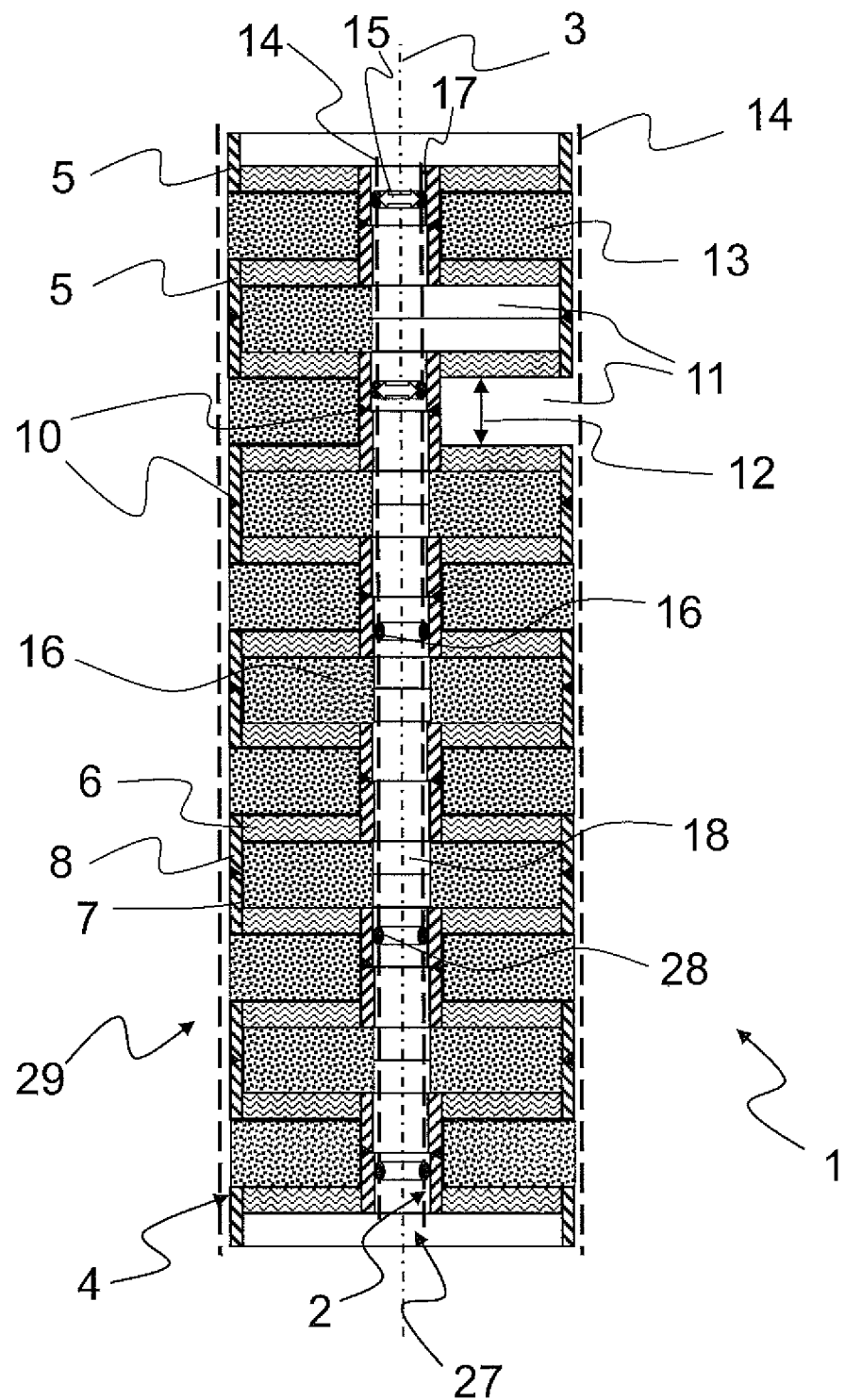
FIG. 2 is a longitudinal-sectional view of a variant embodiment of a thermoelectric module.

FIG. 2 shows an assembled variant embodiment of a thermoelectric module 1. In this case, the semiconductor elements 5 are now disposed and secured to one another alternately along the axis 3 in a butt-jointed manner. The alternative configuration of semiconductor elements 5 is such that the inner frame parts 7 rest against one another and form a connecting region 10 (e.g. a weld seam), with the result that adjacent thereto a free space 11 is formed which extends radially outward as far as the outer circumferential surface 4. The same applies to a free space 11 which extends radially inward from outer frame parts 8 that rest against one another. The free spaces 11 are now configured in such a way that they correspond to a distance 12 between the thermoelectric materials 6 of adjacent semiconductor elements 5. For the sake of clarity, one element (insulating material 13) in the upper right-hand area of FIG. 2 is not shown, although it is in fact provided for operation.

It can furthermore be seen therein that a dimensionally unstable sheath 14 is provided at the interrupted inner circumferential surface 2 and also at the interrupted outer circumferential surface 4. The sheath 14 at the inner circumferential surface 2 can be pushed into a duct 18 within the semiconductor elements 5 after the configuration or preparation of the components of the thermoelectric module 1, for example. A suitable candidate for this purpose is, in particular, a plastic film, e.g. an expansion hose which has spring elements 16 (e.g. spring ring). By virtue of the spring elements 16, a preloading force 15 acts against the inner circumferential surface 2. This expansion hose or this dimensionally unstable sheath 14 then ensures that no water can penetrate into regions within the inner circumferential surface 2. Good heat conduction or cooling toward the semiconductor elements 5 and inner frame parts 7 is likewise guaranteed. For this purpose, the sheath 14 should be made correspondingly thin. In this case, the spring elements 16 form raised portions 28 which bring about mixing of the coolant and avoid laminar boundary flows and can thus increase the efficiency of the thermoelectric module 1. In this case, the spring elements 16 are disposed in such a way that they rest against an inner frame part 7. Adhesive 17 is disposed between the dimensionally unstable sheath 14 and the inner frame parts 7, with the result that, in particular, a sealing joint is achieved between the inner frame parts 7 and the dimensionally unstable sheath 14. In particular, the adhesive 17 is disposed between the dimensionally unstable sheath 14 and the inner frame parts 7 only at the respective ends of the thermoelectric module 1, with the result that a sealing joint with respect, for example, to a cooling system is achieved in this case. A coolant in this case flows through the thermoelectric module 1 through the duct 18. Accordingly, the inner circumferential surface 2 forms a cold side 27. In this case, exhaust gas flows over the outer circumferential surface 4 of the thermoelectric module 1, which accordingly forms a hot side 29.

The porous insulating material 13 is furthermore provided in the region of the open free spaces 11. This is, in particular, an "aerogel." On one hand, the desired large temperature gradient and, on the other hand, the electric neutrality of the free space 11, is thereby guaranteed. It is preferred in this case that the porous insulating material 13 should fill the entire free space 11.

Figure 3:
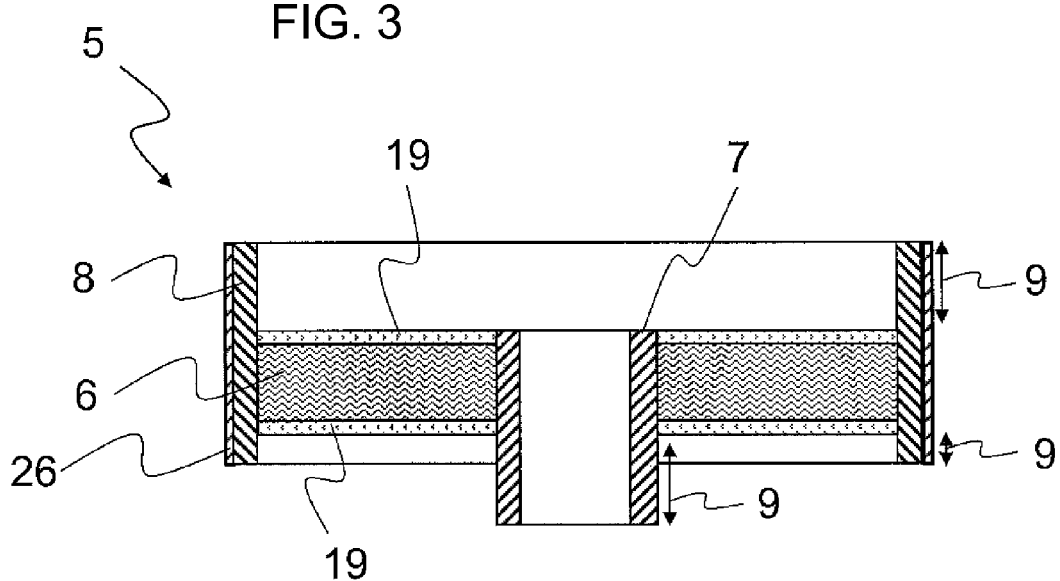
FIG. 3 is a longitudinal-sectional view of another variant embodiment of a semiconductor element.

FIG. 3 shows a longitudinal section through a variant embodiment of a semiconductor element 5 for a thermoelectric module of this kind. In this case, the semiconductor element 5 is made cylindrical, quadrilateral or oval, for example. In the case of the variant embodiment presented therein, a thermoelectric material 6, composed of compressed powder for example, of substantially ring-shaped construction is once again provided. It is likewise preferred that the thermoelectric material 6 should be force-lockingly (and/or materially) connected to the inner frame part 7 and/or to the outer frame part 8 by compression. Provision is then made in this case for a large overlap 9 toward the top to be formed by the outer frame part 8, a small overlap 9 toward the bottom to be formed by the outer frame part 8 and a large overlap 9 to be formed by the inner frame part 7. In this way, the contact regions or free spaces with respect to adjacent semiconductor elements can be configured in the desired manner during configuration to form a thermoelectric module. In order to protect the thermoelectric material 6, e.g. from chemical stresses, from thermal stresses and/or from damage, the thermoelectric material 6 has a coating 19 on boundary surfaces at which it is not covered by the inner frame part 7 or the outer frame part 8. In this case, the coating 19 has a thickness which is made at least many times less than the wall thickness of the outer frame part 8, of the inner frame part 7 and/or of the thermoelectric material 6 itself. A coating 19 containing nickel or molybdenum, in particular a coating composed almost completely of those materials, may be considered, for example, as a material for this coating 19. In this case, the coating 19 serves as a diffusion barrier for the thermoelectric material 6. An insulating layer 26, which insulates the electrically conductive frame part 8 radially toward the outside, e.g. with respect to an outer tube subsequently disposed there, is furthermore shown on the outer frame part 8.

Figure 4:
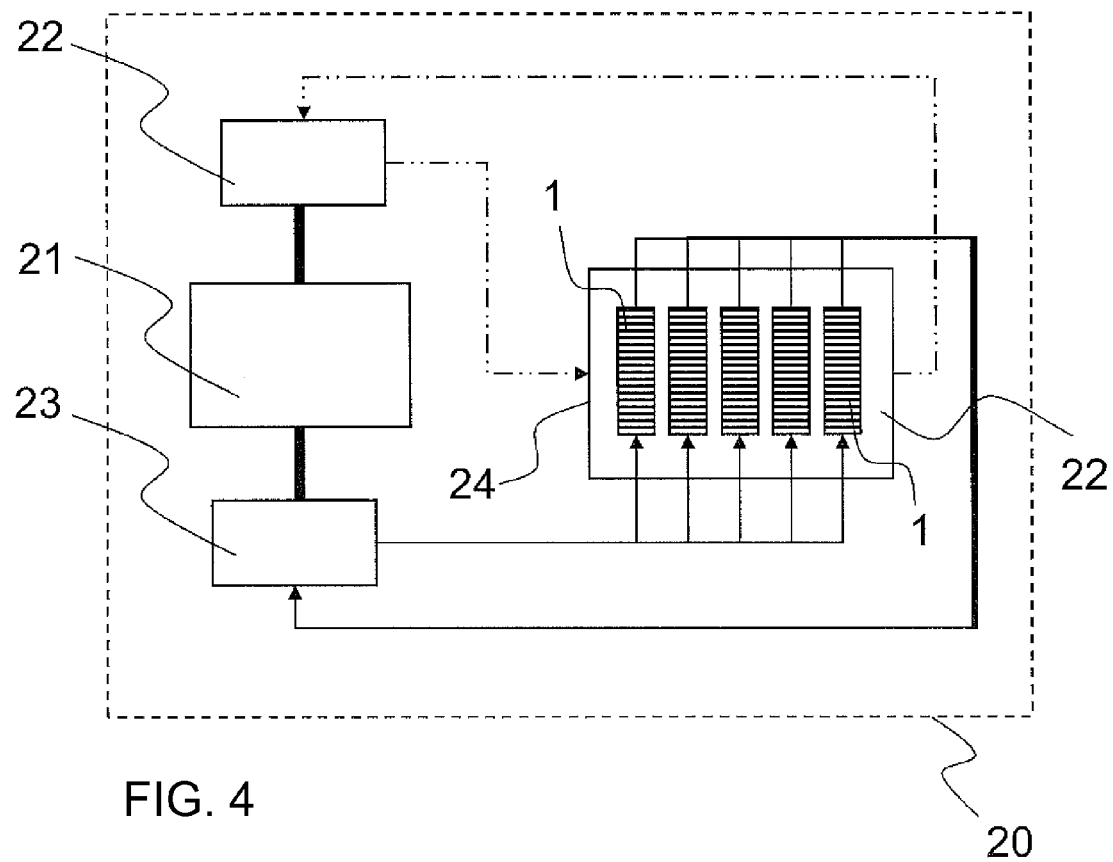
FIG. 4 is a block diagram of a vehicle having a thermoelectric generator.

Finally, a structure of a vehicle 20 which has an internal combustion engine 21, an exhaust system 22 and a cooling system 23, is also illustrated diagrammatically in FIG. 4. Moreover, the vehicle 20 has a thermoelectric generator 24, which has a plurality of the thermoelectric modules 1 according to the invention. The thermoelectric generator 24 is constructed with the exhaust system 22 and the cooling system 23 in such a way that the hot side is formed on the outer circumferential surface 4 of the modules 1 and the cold side is formed on the inner circumferential surface 2 of the thermoelectric modules 1. For this purpose, at least some of the exhaust gas is directed to the thermoelectric generator 24 in such a way that the exhaust gas flows around the outside of the thermoelectric modules 1 before it is fed back into the exhaust system 22 (or to the internal combustion engine 21). In order to form the required temperature profile with regard to the thermoelectric modules 1, coolant is furthermore passed through the individual thermoelectric modules 1 by the cooling system 23 and finally fed back into the cooling system 23 (or to the internal combustion engine 21). Of course, it is possible for the cooling system 23 and/or the exhaust system 22 to be embodied with secondary circuits for exhaust gas and/or coolant. It is likewise possible for additional heat exchangers, flaps, catalytic converters, etc. to be provided, for example, in the exhaust system. It is likewise clear that the thermoelectric generator 24 is also connected electrically to the vehicle 20, e.g. through suitable current collectors, power storage devices, control systems, etc.

The invention thus at least partially solves the problems explained with reference to the prior art. In particular, a thermoelectric module has been indicated which is technically simple to produce, has a reduced number of parts, is stable for the desired application and furthermore has a high efficiency in order to produce electric energy from the thermal energy of an exhaust gas.

The invention claimed is:

1. A thermoelectric module, comprising:
an interrupted inner circumferential surface having an axis;
an outer circumferential surface;
a plurality of semiconductor elements including at least one p-doped semiconductor element and at least one n-doped semiconductor element connected electrically to one another in alternation, said semiconductor elements containing thermoelectric material, said semiconductor elements disposed in a direction of said axis between said interrupted inner circumferential surface and said outer circumferential surface;
at least some of said semiconductor elements having at least an inner frame part, said inner frame parts forming said interrupted inner circumferential surface;
said interrupted inner circumferential surface forming a cold side of the thermoelectric module; and
a dimensionally unstable sheath provided at least at said interrupted inner circumferential surface, said dimensionally unstable sheath provided at least at said interrupted inner circumferential surface being an expansion hose having a preloading force directed toward said outer circumferential surface at room temperature, said preloading force being exerted on said inner frame parts and is at least 15 N/mm$^2$ at room temperature.

2. The thermoelectric module according to claim 1, wherein said semiconductor elements have an outer frame part, said thermoelectric material is disposed between said inner frame part and said outer frame part, and at least said inner frame part projects on one side beyond said thermoelectric material forming a dimensionally rigid connecting region there with an adjacent frame part.

3. The thermoelectric module according to claim 1, wherein adjacent inner frame parts form a free space therebetween at least in said interrupted inner circumferential surface, and a porous insulating material fills said free space.

4. The thermoelectric module according to claim 1, wherein said dimensionally unstable sheath has at least one spring element producing said preloading force.

5. The thermoelectric module according to claim 1, wherein said dimensionally unstable sheath is composed at least partially of at least one of a shape memory alloy or a shape memory polymer.

6. The thermoelectric module according to claim 1, which further comprises an adhesive disposed between said dimensionally unstable sheath and at least said interrupted inner circumferential surface.

7. A vehicle, comprising:
an internal combustion engine;
a thermoelectric generator having a plurality of thermoelectric modules according to claim 1;
an exhaust system in communication with said internal combustion engine and extending externally along said outer circumferential surface of said thermoelectric module; and
a cooling system in communication with said internal combustion engine and extending within and along said interrupted inner circumferential surface of said thermoelectric module.

8. A thermoelectric module, comprising:
an interrupted inner circumferential surface having an axis;
an outer circumferential surface;
a plurality of semiconductor elements including at least one p-doped semiconductor element and at least one n-doped semiconductor element connected electrically to one another in alternation, said semiconductor elements containing thermoelectric material, said semiconductor elements disposed in a direction of said axis between said interrupted inner circumferential surface and said outer circumferential surface;
at least some of said semiconductor elements having at least an inner frame part, said inner frame parts forming said interrupted inner circumferential surface;
said interrupted inner circumferential surface forming a cold side of the thermoelectric module; and
a dimensionally unstable sheath provided at least at said interrupted inner circumferential surface, said dimensionally unstable sheath provided at least at said interrupted inner circumferential surface being an expansion hose having a preloading force directed toward said outer circumferential surface at room temperature, said preloading force being exerted on said inner frame parts and is at least 10 N/mm$^2$ at a temperature of between 150° C. and 250° C. at said dimensionally unstable sheath.

* * * * *